(12) United States Patent
Eglit

(10) Patent No.: US 6,232,952 B1
(45) Date of Patent: May 15, 2001

(54) METHOD AND APPARATUS FOR COMPARING FREQUENTLY THE PHASE OF A TARGET CLOCK SIGNAL WITH THE PHASE OF A REFERENCE CLOCK SIGNAL ENABLING QUICK SYNCHRONIZATION

(75) Inventor: Alexander Julian Eglit, Half Moon Bay, CA (US)

(73) Assignee: Genesis Microchip Corp., Alviso, CA (US)

( * ) Notice: Subject to any disclaimer, the term of this patent is extended or adjusted under 35 U.S.C. 154(b) by 0 days.

(21) Appl. No.: 09/164,080

(22) Filed: Sep. 30, 1998

(51) Int. Cl.[7] .............................. G09G 5/36; G09G 5/00
(52) U.S. Cl. .................... 345/134; 345/127; 345/131; 345/213
(58) Field of Search .................... 345/127–132, 345/134, 213

(56) References Cited

U.S. PATENT DOCUMENTS

| | | | |
|---|---|---|---|
| 4,751,504 | * 6/1988 | Slavin | 345/134 |
| 5,039,937 | * 8/1991 | Mandt et al. | 324/121 |
| 5,111,191 | * 5/1992 | Povenmire | 345/127 |
| 5,570,108 | * 10/1996 | McLaughlin et al. | 345/146 |
| 5,579,462 | * 11/1996 | Barber et al. | 395/14 |
| 5,631,667 | * 5/1997 | Cadwell | 234/134 |
| 5,739,867 | * 4/1998 | Eglit | 345/131 |
| 5,796,392 | * 8/1998 | Eglit | 345/213 |
| 5,905,536 | * 5/1999 | Morton et al. | 348/441 |
| 5,986,635 | * 10/1999 | Naka et al. | 345/127 |
| 6,002,446 | * 12/1999 | Eglit | 345/127 |

* cited by examiner

Primary Examiner—Richard Hjerpe
Assistant Examiner—Duc Q Dinh
(74) Attorney, Agent, or Firm—Law Firm of Naren Thappeta

(57) ABSTRACT

A phase comparator circuit which can compare the phase of a target clock signal with the phase of a reference clock signal with a short comparison cycle. An auxiliary waveform representative of the incremental phase of each of the reference and target clock signals may be generated, and samples on the auxiliary waveforms may be compared to determine the relative phase. The result of the comparison can be used to adjust of the phase of the target clock signal. As several samples can be taken on the auxiliary waveforms, the present invention enables frequent phase comparisons. The frequent comparisons may enable the target clock signal to be synchronized quickly with the reference clock signal. The invention has particular application in display units using phase lock loops (PLLs).

34 Claims, 11 Drawing Sheets

METHOD AND APPARATUS FOR COMPARING FREQUENTLY THE PHASE OF A TARGET CLOCK SIGNAL WITH THE PHASE OF A REFERENCE CLOCK SIGNAL ENABLING QUICK SYNCHRONIZATION

BACKGROUND OF THE INVENTION

1. Field of the Invention

The present invention relates to computer graphics systems, and more specifically to a method and apparatus for generating a clock signal synchronized with a reference clock signal.

2. Related Art

There is often a need to generate a clock signal ("target clock signal") which is synchronized with a reference clock signal. The two clock signals generally have unequal frequencies. For the purpose of illustration, the target clock signal may need to have a frequency of X/Y times the frequency of the reference clock signal, wherein X and Y are integers.

U.S. Pat. No. 5,739,867 entitled, "A Method and Apparatus for Upscaling an Image in Both Vertical and Horizontal Directions", Issued Apr. 14, 1998, naming as inventor Alexander Julian Eglit, discloses an example situation in which such a need arises. The patent discloses a scaling circuit which scales a source image of A×B pixels into a destination image of C×D pixels without requiring large memories. The scaling circuit there scales the image by using a destination clock signal having ((C×D)/(A×B)) times the frequency of a source clock. The source clock is used as a reference clock and the destination clock is the target clock signal.

In a prior system, synchronization may be achieved by dividing a target clock signal by X and the source system clock by Y, comparing the phase of the resulting divided clock signals, and adjusting the phase of the target clock signal. Such a technique may be used in environments using digital or analog phase lock loops (PLLs) as is well known in the relevant arts.

In general, a target clock signal is more accurately synchronized with a reference clock signal if the time between successive comparisons ("comparison cycles") is small because the shorter comparison cycles enable the phase of the target clock signal to be adjusted more frequently. Accordingly, both X and Y may be divided by a common denominator (CD), and the resulting numbers may be respectively used instead of X and Y. The comparison cycles may be shorter proportionate to the CD. in the upscaler embodiment noted above, the number of comparison cycles within a frame equals the CD used to divide (A×B ) and (C×D).

However, it may not be possible to make the comparison cycles short in several situations. For example, in the above technique, the greatest common denominator (GCD) of X and Y can be a number as low as 1. Such a situation may be further illustrated with the upscaler of U.S. Pat. No. 5,739,867. If a source image of size 800×600 pixels is to be upscaled to an image of size 1901×1501, only a very low GCD may be present. The upscaled image size may be specified by a user using a suitable user interface. A low GCD may lead to large comparison cycles.

Large comparison cycles may be problematic in several situations. For example, in techniques using PLLs to generate a target clock signal, large synchronization periods may result in large settling times and phase jitter. Phase jitter typically leads to display artifacts. Large settling times may be unacceptable as the tracking and correction abilities of the PLLs may be under-utilized. The problems caused by underutilization depend on the environment in which the PLL is used. For example, a monitor (e.g., using an upscaler according to U.S. Pat. No. 5,739,867) may take unacceptably long time in starting to display an image when a target image size is changed.

Furthermore, computation of CDs for large numbers and/or the division of X and Y by the CD may require unacceptably long time or complex circuits.

Accordingly, what is needed is an effective method and apparatus for synchronizing a target clock signal with a reference clock signal.

SUMMARY OF THE INVENTION

The present invention is directed to clock generation circuits which generate a target clock signal synchronized with a reference clock signal. Specifically, a phase comparator is provided, which compares frequently the phases of a target clock signal and a reference clock signal, and generates signals representative of the relative phase of the two signals. The generated signals can be used to adjust the phase of the target clock signal.

A phase comparator in accordance with the present invention may include a first circuit to generate a waveform representative of the incremental phase advancement of the reference clock signal, and a second circuit for generating a waveform representative of the incremental phase advancement of the target clock signal.

In an embodiment, the two waveforms are designed to have the same frequency such that the phase of the two waveforms represent the phase advancement of the two clock signals. To simplify the comparison process, the two waveforms may be generated such that the instantaneous amplitude is reflective of the phase of the waveform.

Thus, a sample may be taken at the same time point (synchronously) of the two waveforms, and the samples are compared to determine the phase relationship of the reference and target signals. The phase of the target clock signal is adjusted to according to the result of the comparison.

The manner in which the two waveforms (having same frequency and with the amplitude reflecting the phase advancement) can be generated is illustrated with reference to generating a target clock signal which may need to have a frequency of (X/Y) times the frequency of the reference clock signal. Two phase accumulators are maintained, with the output of each phase accumulator representing the incremental phase advancement of the corresponding clock signal.

The first phase accumulator is incremented by X for each clock tick (or clock period) of the reference clock signal, and the second accumulator is incremented by Y for each clock tick of the target clock signal. As may be readily appreciated, the outputs of the phase accumulators represent the incremental phase advancement of the corresponding clock signals, and samples (at the same time point) on the waveforms can be taken for adjusting the phase of the target signal.

A micro view of such waveforms readily reveals that the two waveforms are advanced as steps, with amplitude difference between steps of X for the first waveform (corresponding to the reference clock signal), and a difference of Y for the second waveform. The time duration of each step in the steady-state is inversely proportional to the amplitude difference, with the result that the two waveforms have the same phase advancement over a reasonably long duration.

Therefore, a graph of the instantaneous amplitude difference of the two waveforms would reveal small differences even if the target and reference clock signals are perfectly synchronized. The differences would average out to zero over some duration. A signal representing these small differences may be termed as ripple.

As the differences represented by the ripple would average out to zero, it is generally desirable that the phase of the target signal not be modified due to such differences. Therefore, an aspect of the present invention provides a circuit to minimize or eliminate the tracking of the ripple components. For example, a combination of approaches (noted below) can be used for such a purpose.

The comparison cycle may be made reasonably long by effecting phase correction only once a few potential sample points on the waveforms. In addition, only phase differences greater than a predetermined magnitude may be used in modifying the phase of the target clock signal.

Furthermore, a multiplexor may be employed which selects the output of the phase comparator of the present invention only when the target clock signal phase may need to be modified quickly, while selecting the output of other circuits during steady state. As a result, the present invention may quickly synchronize the target signal with a reference clock signal, while eliminating the ripple effects during steady state.

A low pass circuit can also be used at the output of the phase comparator such that short term changes do not affect the phase of the target clock signal. A PLL using the phase comparison signals can also be implemented with a narrow loop bandwidth.

Thus, using a combination of one or more of the above approaches, phase ripple tracking may be avoided or reduced, while ensuring the target clock signal of the desired frequency is generated quickly.

Therefore, the present invention enables quick comparison of the phases of a target clock signal and a reference clock signal such that the comparisons can be used for frequent adjustment of the phase of the target clock signal. This is enabled by generating auxiliary waveforms which indicate the incremental phases of the target and reference clock signals, and by comparing samples on the two waveforms.

The present invention enables a target clock signal having frequency of a (X/Y) times the frequency of a reference clock signal to be generated. This is enabled by advancing the phase of the first auxiliary waveform by X for each clock tick of the reference clock signal, and by advancing the phase of the second auxiliary waveform by Y for each clock tick of the target clock signal.

The present invention enables prevention or reduction of tracking of ripple in spite of enabling frequent comparison. This is enabled by providing several approaches, a combination of which can be used.

The present invention is particularly suited for use in digital display units of computer systems as the clock signal generated can be used in scaling an image without using large buffers.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

The present invention enables frequent comparison of the phases of a target clock signal and a reference clock signal. The result of the phase comparison can then be used to adjust the phase of the target clock signal. Using such frequent comparisons, a target clock signal may be quickly and accurately synchronized with a reference clock signal.

The present invention and the advantages can be appreciated by an understanding of the manner in which example prior systems generate a target clock signal synchronized with a reference clock signal.

2. Example Prior System

Figure 3:
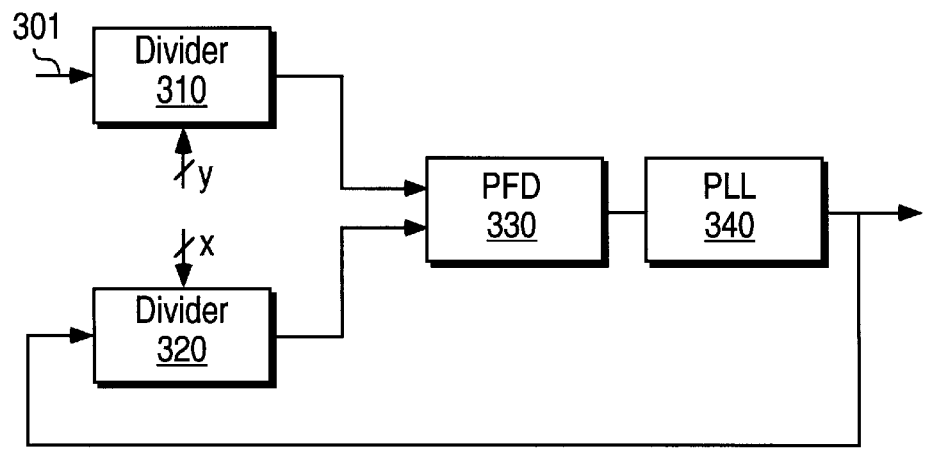
FIG. 3 illustrates a typical prior art clock generation circuit with potentially large comparison cycles.

FIG. 3 is a block diagram illustrating an example prior circuit 300 which generates a target clock signal synchronized with a reference clock signal. The operation of clock synchronization circuit 300 is described with combined reference to FIGS. 1A and 1B also. For purpose of illustration, the desired target clock signal (shown as 108 in FIG. 1A) will be assumed to have a frequency of 5/4 times the frequency of the reference clock signal (shown as 107 in FIG. 1A).

Phase and frequency detector (PFD) 330 receives a divided reference clock signal and a divided target clock signal, compares the phase of the two signals, and generates signals to PLL 340 indicating whether the divided target clock signal lags, leads or is in phase with the divided reference clock signal. PLL 340 may receive the signals and adjust the phase of the generated target clock signal according to the output of PFD 330 in a known way. The manner in which the adjustment may be performed is described in further detail below with reference to FIG. 1B.

The reference clock is received on line 301, and the clock signal may be divided by 4 (Y) using divider 310 in a known way. The divided reference clock signal is shown as signal 140 in FIG. 1B. The target clock signal is received by divider 320, which divides the target clock signal by 5 (X).

When the reference clock signal is synchronized with the target clock signal, PFD 330 indicates that two signals are synchronized, and PLL 340 generally need not alter the phase of the target clock signal. However, when the two signals are not synchronized, PLL 340 may need to adjust the phase of the target clock signal to achieve synchronization as desired. The manner in which synchronization may be achieved is described in further detail with reference to FIG. 1B.

Figure 1:
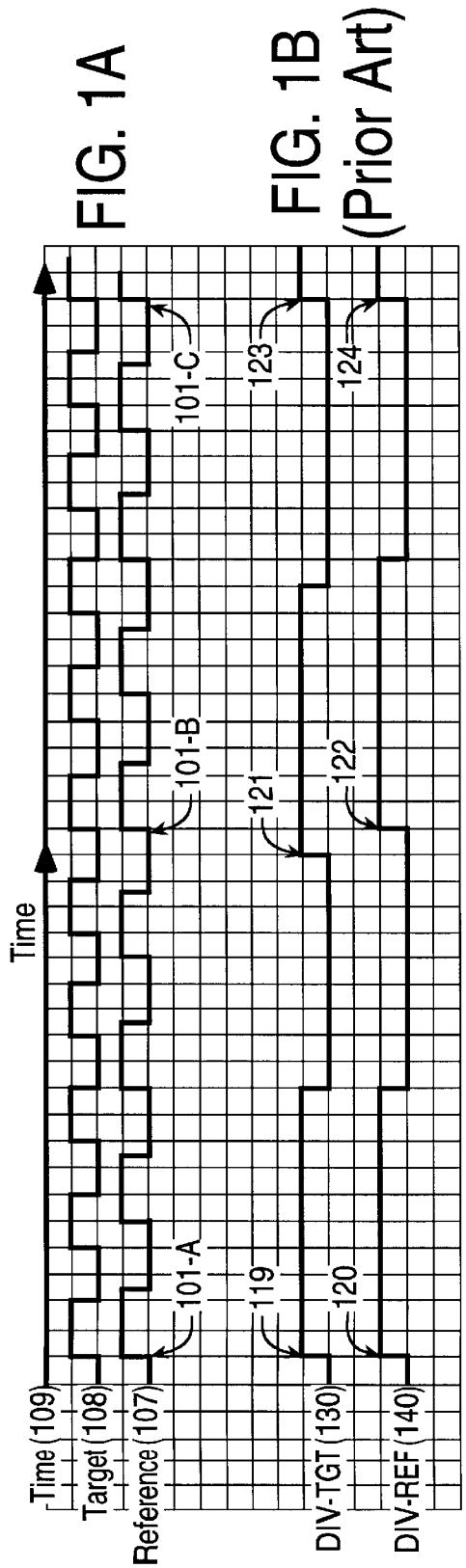
FIG. 1A is a timing diagram illustrating a desired target clock signal in relation to a reference clock signal.
FIG. 1B is a timing diagram illustrating the large comparison cycles typically present in several prior art systems.

Divided target clock signal 130 of FIG. 1A (does not correspond to desired signal 108) is shown lagging the divided reference clock signal 140 as may be readily observed from points 121 and 122. Accordingly, PFD 330 may generate signals representing that the target clock signal generated by PLL 340 is lagging behind. In response, PLL 340 may advance the phase of the target clock signal.

It may be noted that comparisons are performed based on points 119–124. Points 119–124 may be referred to as zero crossings. By dividing reference and target clock signals by appropriate numbers, the zero crossings would occur at the same time (shown at 119 and 120) when the two clock signals are synchronized. Any phase difference between the divided signals is used for adjusting the phase of the target clock signal.

From the above, it may be noted that the comparison cycle frequency equals (target clock signal frequency/X), which equals (reference clock signal frequency /Y), wherein X and Y are integers. In the above illustration, X=5 and Y=4. Also, the target clock signal frequency=(X/Y)×reference clock signal frequency.

If the values of X and Y are large (for example., due to the absence of a large common denominator), the comparison cycle period may be unacceptably high, and the time to synchronize the target signal with the reference signal can be unacceptably long. The manner in which the target signal can be synchronized quickly and accurately irrespective of the values of X and Y is described with reference to the flow-chart of FIG. 5.

3. Method According to the Present Invention

Figure 5:
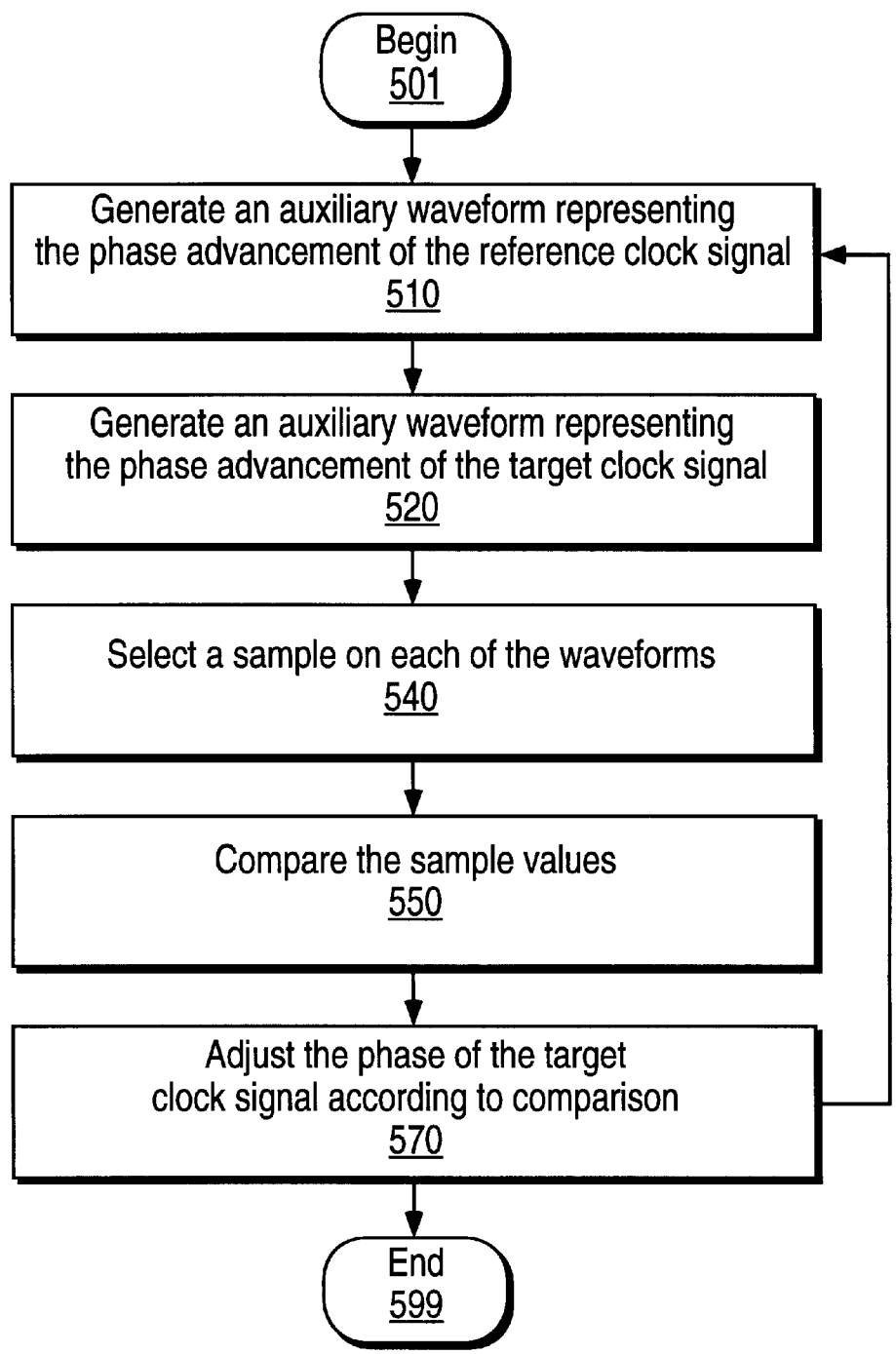
FIG. 5 is a flow-chart illustrating a method according to the present invention.

FIG. 5 is a flowchart illustrating the manner in which a target signal can be synchronized quickly and accurately with a reference signal. In step 510, a waveform representing the phase of the reference clock signal is generated. The waveform can be of any shape. In an embodiment described below, the waveform having the shape of a ramp may be generated. In step 520, a second waveform representing the phase of the target clocks signal may be generated. The second waveform can have the same shape and frequency of the first waveform to simply the phase comparisons.

In step 540, a sample is selected on each of the two waveforms, preferably at the same time point (synchronously). In step 550, the sample values are compared. The comparison generally indicates the relative phase of the two signals. In step 570, the phase of the target clock signal can be adjusted in a known way.

Several embodiments can be implemented in accordance with the method described above. The invention is described below with reference to several example embodiments.

4. Circuit According to the Present Invention

Figure 2:
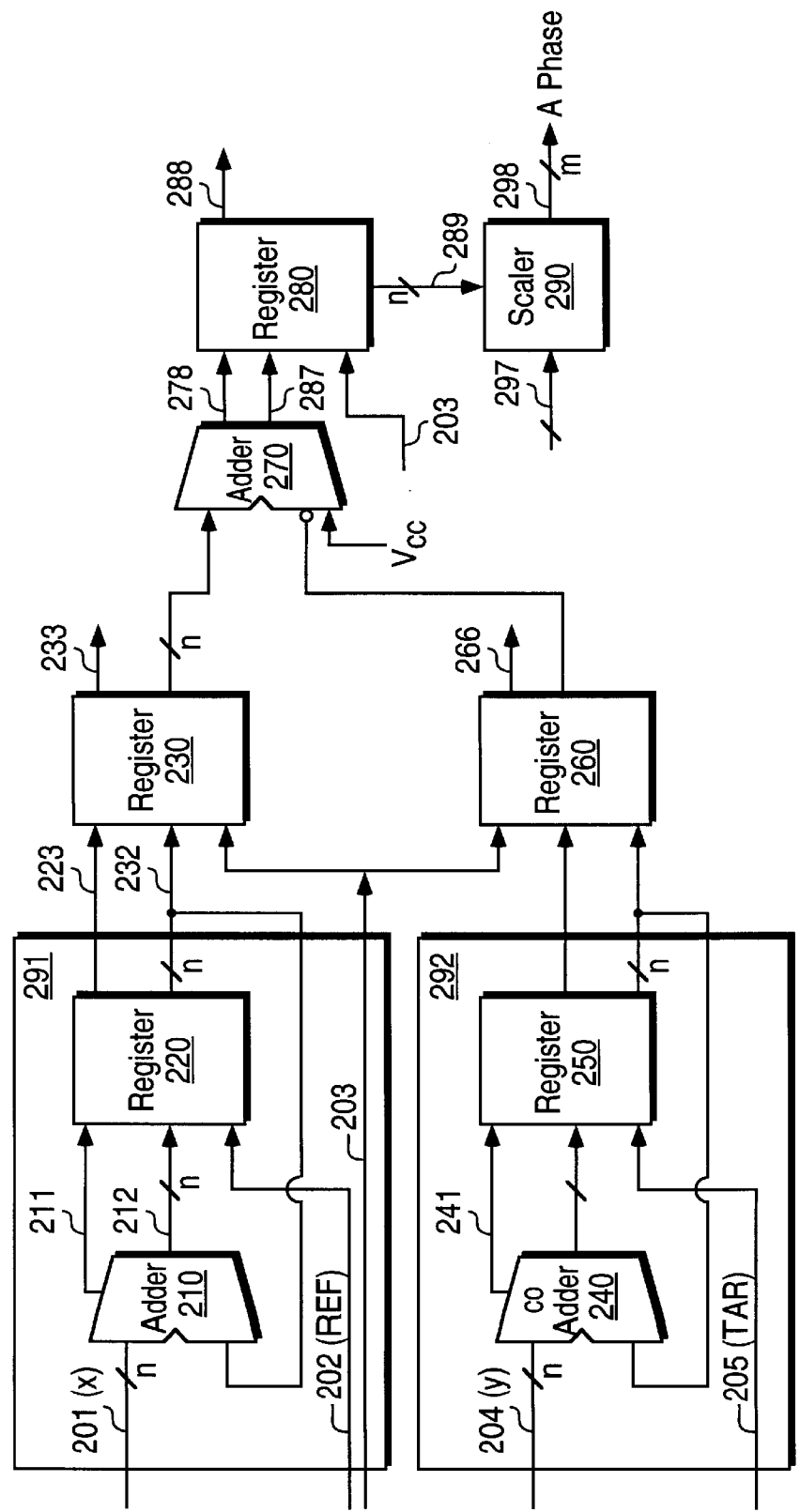
FIG. 2 is a block diagram of an embodiment of phase comparator in accordance with the present invention.

FIG. 2 is a block diagram of an embodiment of phase comparator 200 illustrating the manner in which the method of FIG. 5 can be implemented. Phase comparator 200 generates a target clock signal having (X/Y) times the frequency of a reference clock signal, wherein X and Y are integers. Phase comparator 200 may include phase accumulators 291 and 292, registers 230, 260 and 270, and scaler 290. Each block is described below in further detail.

Phase accumulator 291 generates a number representing the incremental phase advancement of a reference clock signal. In an embodiment, phase accumulator 291 may be implemented using adder 210 and register 220 (an example memory element). Adder 210 may receive number X on line 201 from a programmable register, which enables the present invention to be used to operate with any value of X. Adder 210 adds X to the register value stored in register 220 upon each clock tick of the reference clock signal received on line 202, and the result is again stored in register 220. Any carry value generated by adder may be stored in register 220 and provided on line 223. As will be readily appreciated, the output of phase accumulator 291 represents the incremental phase advancement of the reference clock signal.

Phase accumulator 292 operates similar to phase accumulator 291, but with different inputs. Register 250 is clocked by the target clock signal (received on line 205) and the value Y is provided as input on line 204. The output of register 250 represents the number of target clock signal cycles times Y. Adder 270 (an example of a comparator) may subtract the outputs (samples) of the two phase accumulators 291 and 292.

It may be appreciated that the outputs of phase accumulators 291 and 292 respectively represent the waveforms representing the incremental phase advancement of the reference clock signal and the target clock signal. It may be noted that the output of phase accumulators 291 and 292 are generated a synchronously, and comparison at random time points may lead to unpredictable results.

Registers 230 and 260 operate to ensure that the outputs of phase accumulators 291 and 292 are provided for comparison on a common clock. Registers 230 and 260 are clocked by a high-frequency clock signal. In an embodiment, the clock signal may have a frequency of no less than the faster of the two clock signals (i.e., reference and target clock signals). Upon the rising edge of the reference clock signal, registers 230 and 260 may load the outputs of registers 220 and 250 respectively.

Other circuits to provide synchronous inputs to adder 270 will be apparent to one skilled in the relevant arts, and such circuits are contemplated to be within the scope and spirit of the present invention. An example modification to the circuit in FIG. 2 is illustrated with reference to FIG. 4. Only the relevant differences are shown in FIG. 4.

Figure 4:
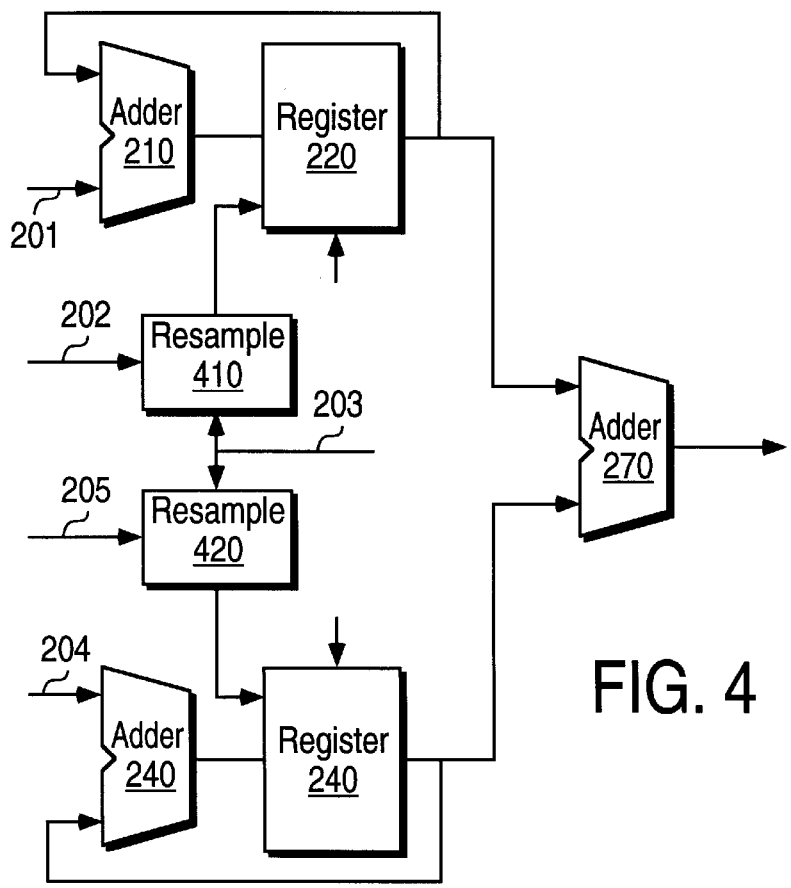
FIG. 4 is a block diagram illustrating the manner in which samples may be taken synchronously from waveforms representing the incremental phase advancement of reference and target clock signals.

With reference to FIG. 4, resampling circuits (well known in the relevant arts) 410 and 420 are clocked by the high frequency clock signal provided on line 203. Resampling circuits 410 and 420 generate the clock enable signals for registers 220 and 240 respectively. As a result, any changes to the outputs of registers. 220 and 240 occur on a common clock. Adder 270 generates the difference of the two received values.

Continuing with reference to FIG. 2, scaler 290 may receive an n-bit number and scale it to an m-bit number, wherein n is greater than m. The scaling factor may be specified on bus 297. The scaling operation may be performed as a simple shift operation in an embodiment. The output of scaler 290 also represents the accumulated phase difference of the reference and target clock signals. In addition, scaler 290 may be designed to limit or eliminate the ripple effects by scaling down the n-bit number as described in further detail below.

Register 280 may store the outputs of adder 270. The value on bus 287 may represent the magnitude of result of the subtraction (and again provided on bus 289), while signal 278 may represent the sign of the result of the subtraction. The value on line 278 is provided on line 288 by register 280.

The value on line 288 indicates whether the target clock signal is lagging (on a value of 1) or leading (0) the reference clock signal. However, when only one of the adders 210 and 240 generates a overflow (carry-out) signal, the value on line 288 may not represent the leading/lagging status accurately. The situations when either or both of the adders 210 and 240 generate a overflow signal are termed as boundary condition. The carry-values on lines 233 and 266, and the phase comparison (provided on line 288) may be used in boundary conditions as described below with reference to FIGS. 6, 7A and 7B.

The circuit elements of FIG. 2 described above are merely illustrative. Several variations withing the scope and spirit of the present invention will be apparent to one skilled in the relevant arts. For example, adders 210, 240 and 270 may be implemented by a multi-input adder (i.e., as one block). Such variations are contemplated to be within the scope and spirit of the present invention.

It is helpful to first understand the manner in which the output of phase comparator 200 can be used in synchronizing the clock signals. This is further illustrated with reference to FIG. 7A.

5. Synchronizing the Reference Clock Signal

Figure 7A:
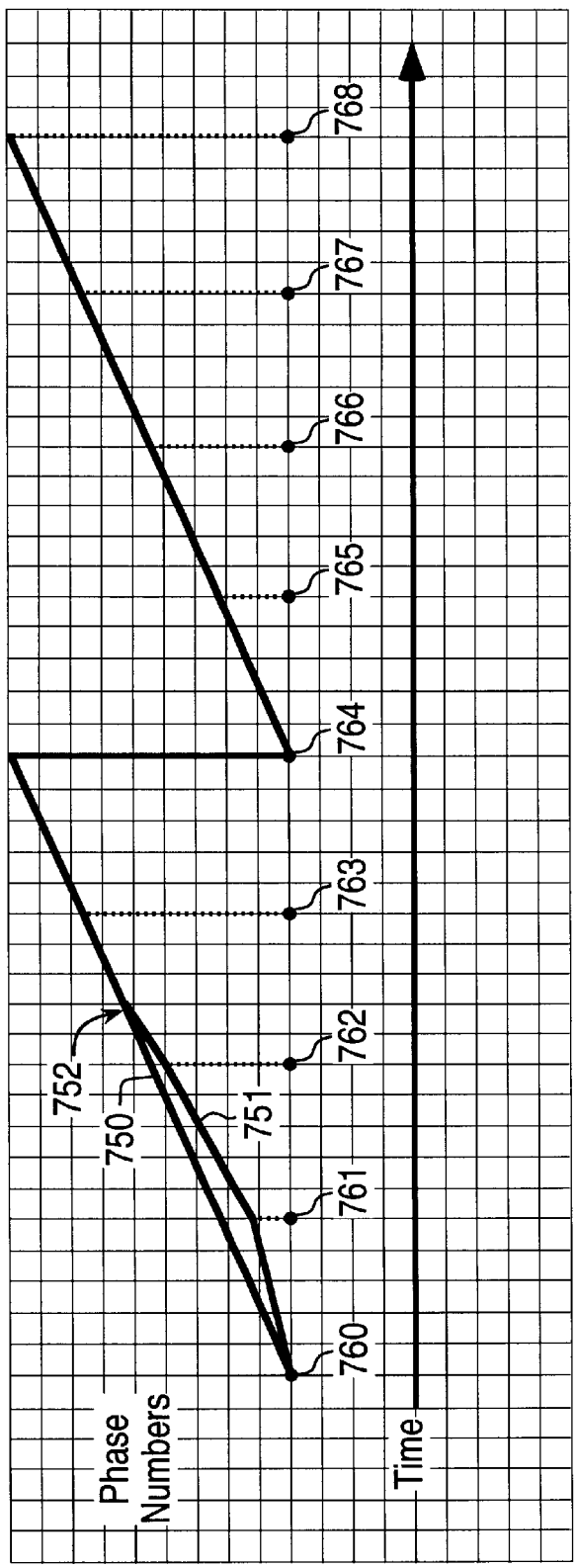
FIG. 7A is a timing diagram illustrating the manner in which the phase of a target clock signal can be adjusted in accordance with the present invention.

The manner in which the output of adder 270 (or scaler 290) can be used to synchronize the target clock signal with a reference clock signal is illustrated with reference to the graph of FIG. 7A. X-axis represents time, while Y-axis represents the phase accumulated by the adders. Specifically, line 750 represents the output of phase accumulator 291 and line 751 represents the output of phase accumulator 292. Thus, the values on the two lines 750 and 751 represent the incremental phase advancement of the reference and target clock signals respectively. For clarity, the outputs are shown as continuous ramp (linear) functions. In reality, the signals represent a stairway, with the value being incremented at the rising edge of the corresponding clock signal.

Points 761–768 represent uniform comparison points. That is, the time duration between these points represents the comparison cycles. It should be appreciated that the comparison period can be as short as the high frequency clock period supplied on line 203. However, frequent comparisons may be undesirable. Accordingly, a comparison cycle typically contains several of these high frequency clock cycles. At the same time, the comparison cycle needs to be short enough such that the target clock signal can be made to track the reference clock signal at a required accuracy.

Extending the circuit of FIG. 2 to use the output of adder 270 at a predetermined number of high frequency clock cycles will be apparent to one skilled in the relevant arts. For example, adder 270 may be clocked to subtract only at a required periodic frequency. In the alternative, such an extension may be implemented in scaler 290.

The signals between time points 760 and 763 illustrate the manner in which the outputs of phase comparator 200 can be used for achieving the desired synchronization. At time point 761, the target clock signal may be determined to be lagging as the output of adder 210 is more than the output of adder 240 at that time point. The extent of the lag may also be determined based on the difference, and the phase of the target clock signal may be adjusted accordingly.

Thus, the phase of the target clock signal is advanced from point 761 onwards, and the phase difference may be determined to have decreased at time point 762. The phase of the target clock signal may be further advanced until the two clocks are synchronized at point 752. The two clock signals are shown synchronized from time point 752 onwards.

The difference value generated by scaler 290 (or that value generated on bus 287) along with the phase comparison signal 288 may accurately represent the phase relationship between the target and reference clock signals except if the two signals are out-of-synchronization at points such as 764 and 768. These time points may be referred to as boundaries. The problem at boundaries and the manner in which an aspect of the present invention addresses the problem is described below.

6. Boundary Conditions

The boundary conditions are described first with reference to FIG. 2. Adder 210 is assumed to generate numbers of n-bits wide for illustration. When the result of the addition equals or exceeds $Q=2^n$, the number represented by adder 210 wraps around (i.e., operates as modulo Q), with a overflow signal being generated on line 211 and propagated to line 233. Similarly, line 266 may also indicate the presence of a overflow signal generated by adder 240 at the boundaries. Thus, at time points 764 and 768 of FIG. 7A, both the adders would generate a overflow signal.

Figure 7B:
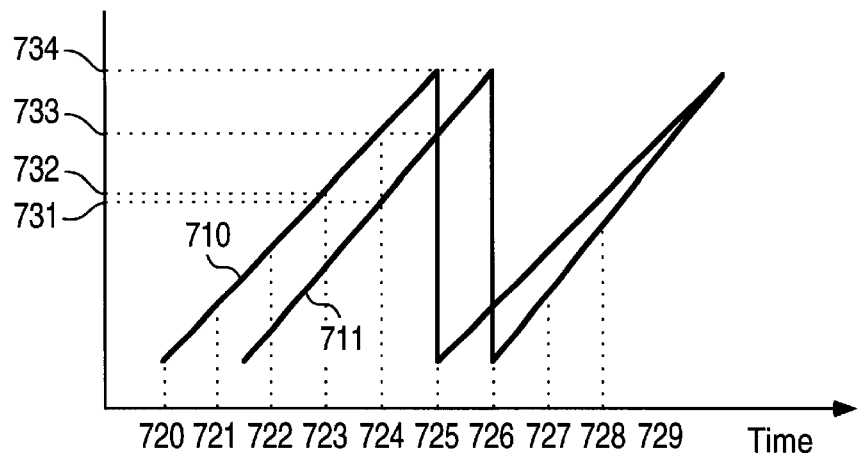
FIG. 7B is a timing diagram illustrating the problems in determining the phase relationship between target and reference clock signals when the accumulated phase for at least one of the clock signals reaches the maximum number represented by a register storing the phase values.

The problems which may occur if the two clock signals are out-of-synchronization at the boundaries is illustrated with reference to FIG. 7B. Line 710 represents the incremental phase advancement of the reference clock signal, while line 711 represents the incremental phase advancement of the target clock signal. Also, very little phase adjustment is shown between time points 721 and 725 to illustrate the problem at the boundaries.

At time point 724, incremental phase advancement 711 of target clock signal (having a value of 732) is shown lagging incremental phase advancement 710 of reference clock signal (having a value of 733). Just before time point 725, incremental phase advancement 710 reverts to a low value (close to zero) with the overflow signal being turned on. For any sample values between time points 725 and 726 (when incremental phase advancement 711 wraps around), the absolute values on incremental phase advancement 710 will be lower than those on incremental phase advancement 711 even though the reference clock signal is leading the target clock signal. Therefore, the value on line 288 may not accurately represent the lead/lag relationship. One embodiment for accurately determining whether the phase is correctly lagging or leading is described below with reference to FIG. 6. Before tuning to FIG. 6, the phase advancement signals 710 and 711 are described in further detail with reference to FIG. 7C, and some problems associated with ripple are noted.

7. Micro-view of the Auxiliary Waveforms

Figure 7C:
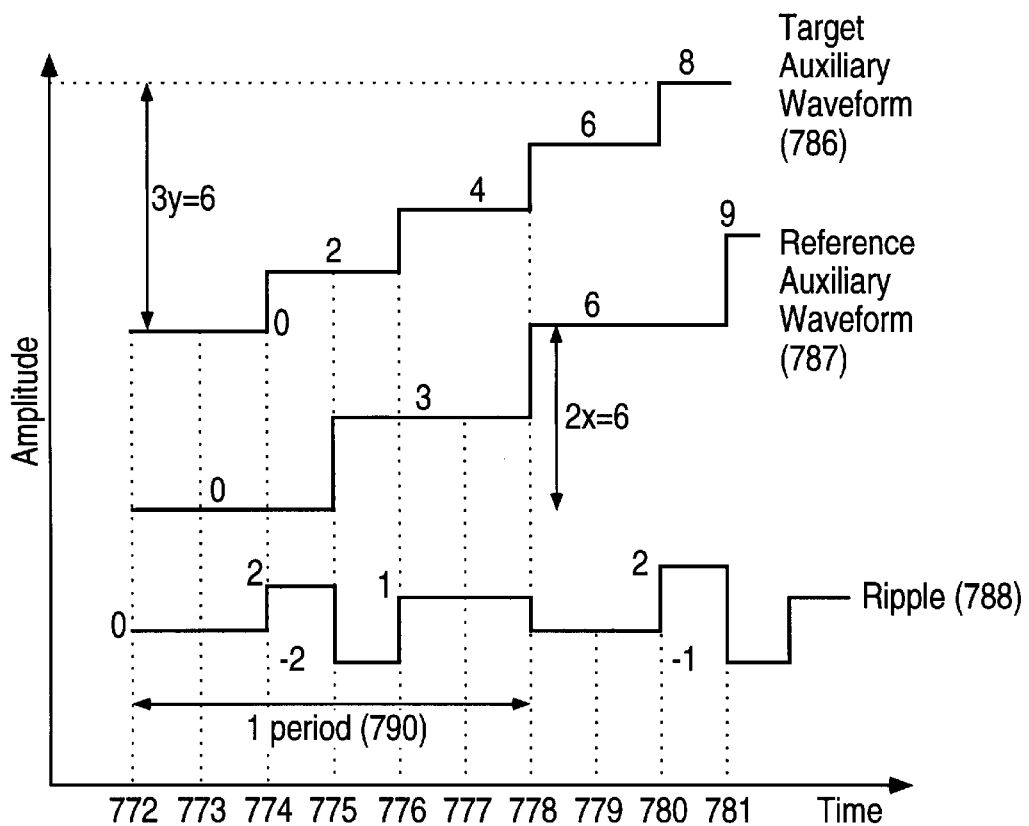
FIG. 7C is a timing diagram illustrating the ripple signal.

FIG. 7C illustrates a situation when the target clock signal has (3/2) times the reference clock signal frequency. That is, X=3 and Y=2 in our illustrations. Accordingly, the auxiliary waveform (786) for the target signal is incremented by Y=3 as shown with signal 786, and the auxiliary waveform (787) for the reference clock signal is incremented by X=3 as shown with signal 787. For illustration, the high frequency clock signal is shown with three times the reference clock signal frequency, and the positive edges (ticks) of the high frequency clock signal are shown at point 771–781.

In a synchronized situation, a positive edge of the target clock signal is received every two high frequency clock periods, which equals three clock periods on the reference clock signal. Accordingly, signals 786 and 787 are shown incremented every two and three clock periods respectively.

The difference in the voltage levels of the signals 786 and 787 is shown as ripple signal 788. Even though the target and reference clock signals are synchronized, it is readily observed that the instantaneous voltage levels on signals 786 and 787 are not equal. Ripple signal 788 may have components which average to zero in some duration. In general, ripple is caused due to the quantization errors resulting from the sampling of the auxiliary waveforms.

While the present invention enables short comparison cycles, ripple may pose some problems. For example, phase comparisons may provide results which indicate an absence of synchronization even though the two clock signals are perfectly synchronized. Comparison between time points 775 and 776 may lead to an erroneous determination that the target clock signal is lagging, which comparison between time points 780 and 781 may lead to a determination that the reference clock signal is leading. In fact, the target clock signal is synchronized in a desired manner during time duration 772–781, and the ripple voltage 788 may average to zero within a ripple signal period 790.

Therefore, mere reliance on the comparisons may lead to unneeded adjustments of the target clock signal, and may be undesirable. The ripple effects can be avoided using several approaches. Some example approaches are described below.

8. Accurate Determination of Phase Lag/Lead Indication

Figure 6:
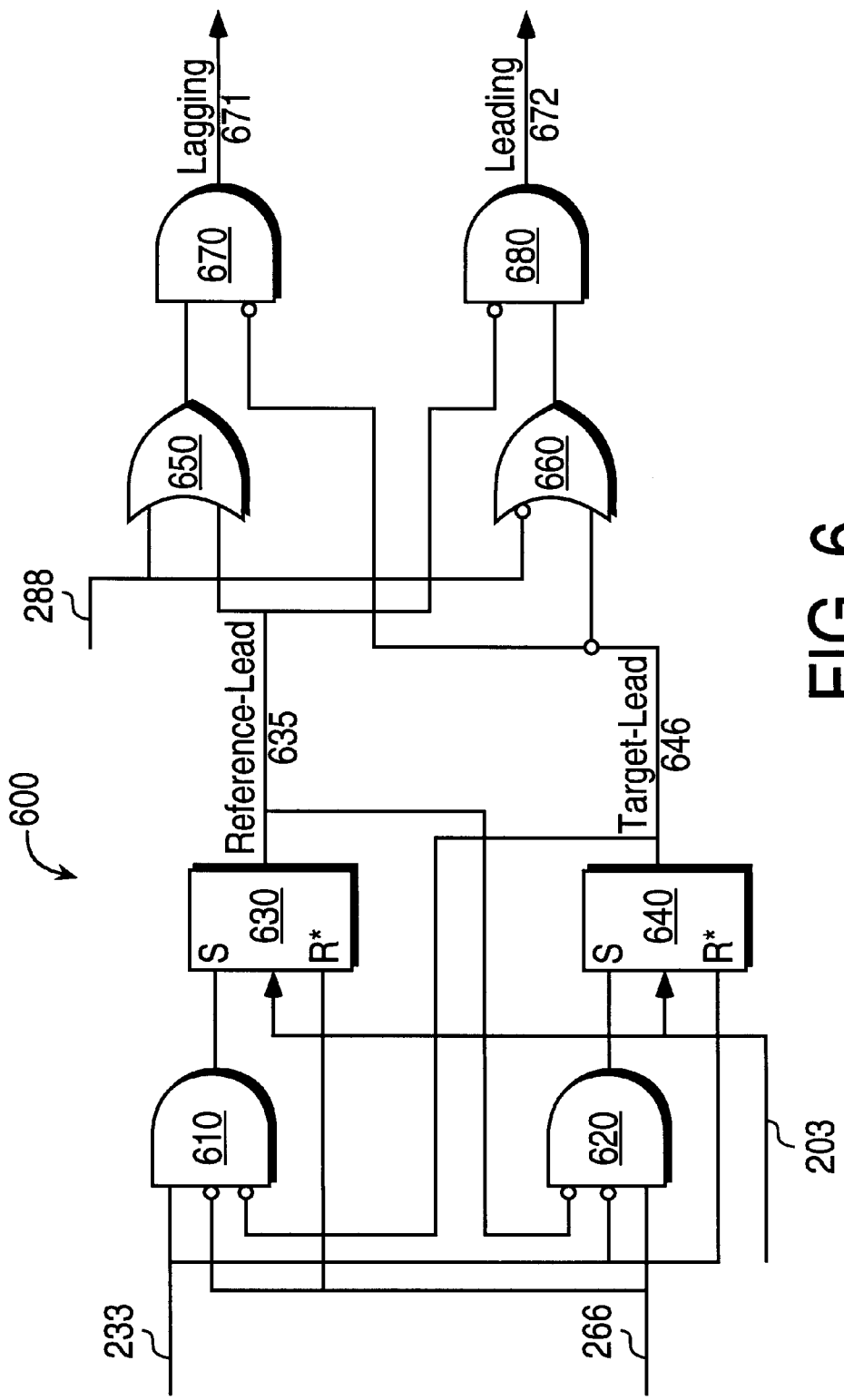
FIG. 6 is a block diagram illustrating the manner in which the phase relationship between the target and reference clock signals can be accurately determined when the accumulated phase for at least one of the clock signals reaches the maximum number represented by a register storing the phase values.

FIG. 6 is a block diagram of lag/lead determination circuit 600, which operates from several signals generated in the embodiment of FIG. 2. The output of flip-flop 630 is set to 1 when adder 210 causes a overflow signal to be generated on line 233 and adder 220 does not cause a overflow signal to be generated on line 241. The output stays at 1 until the overflow signal is received on line 266.

That is, when the reference clock signal is leading and a wrap-around occurs in the process, flip-flop 630 output (line 635) is set to 1. The value stays at 1 until the other signal also wraps around. Similarly, the output (line 646) of flip-flop 640 is set to 1 when the target clock signal is leading, and reset to 0 when there is an overflow on adder 210.

When the output of register 630 is 1 or when the value on line 288 is 1 (indicating that in the value received by adder 270 for the reference clock signal is more), the output of OR gate 650 is set to 1. Similarly, when the result on line 288 is 0 or when the result of register 640 is set to 1, the output of OR gate 660 is set to 1.

AND gate 670 propagates the OR gate 650 as output only if the output of register 640 is set to zero. This addresses the situation when line 288 indicates that the reference clock signal incremental phase advancement value is greater than the target clock signal incremental phase advancement value, but only the adder computing the target clock signal incremental phase advancement value has wrapped around. In such a situation, the target clock signal is fact leading.

Therefore, the output of AND gate 670 is set to 1 to indicate the reference clock signal is leading. The output of AND gate 680 is set to 1 when the target clock signal is leading. Thus, using a circuit such that shown in FIG. 6, a accurate determination of the leading or lagging signal can be made. The output of adder 270 on bus 287, the output of register 280 on bus 289 or the output of scaling circuit 290 represents the degree of the phase difference.

Using the two signals, several circuits may adjust the phase of the target clock signal to achieve the desired synchronization. Some example PLL circuits which can generate target clock signals using the present invention are described below with reference to FIGS. 8A and 8B.

9. PLL Circuits

Figure 8A:
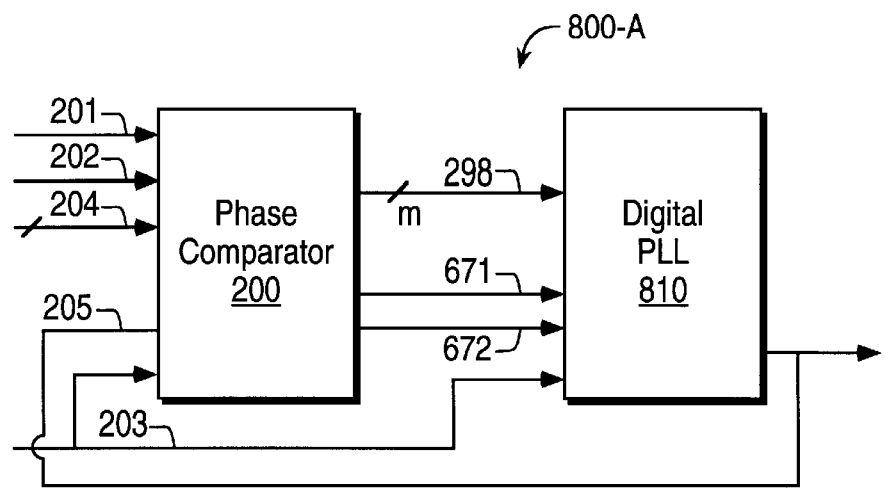
FIG. 8A is a block diagram illustrating the use of a phase comparator in conjunction with a digital PLL.

FIG. 8A is a block diagram of a clock generation circuit 800-A illustrating the use of phase comparator 200 in a digital phase lock loop (PLL) environment. Phase comparator 200 generates a number representative of the degree of phase difference of a target clock signal (205) and a reference clock signal (202). The lead 671 and lag 672 lines indicate whether the target clock signal is leading or lagging the reference clock signal. The outputs of phase comparator 200 can be used to synchronize the target clock signal with the reference clock signal.

An embodiment of digital PLL is described in U.S. Pat. No. 5,796,392, entitled, "A Method and Apparatus for Clock Recovery in a Digital Display Unit", naming as inventor Alexander J. Eglit, and is incorporated in its entirety into the present application. The embodiment there may use digital components exclusively for tracking the reference clock signal and for phase acquisition. Phase comparator 200 is referred to as phase frequency detector (PFD) in that patent. However, the present invention can be employed in other types of digital PLL environments as well.

Figure 8B:
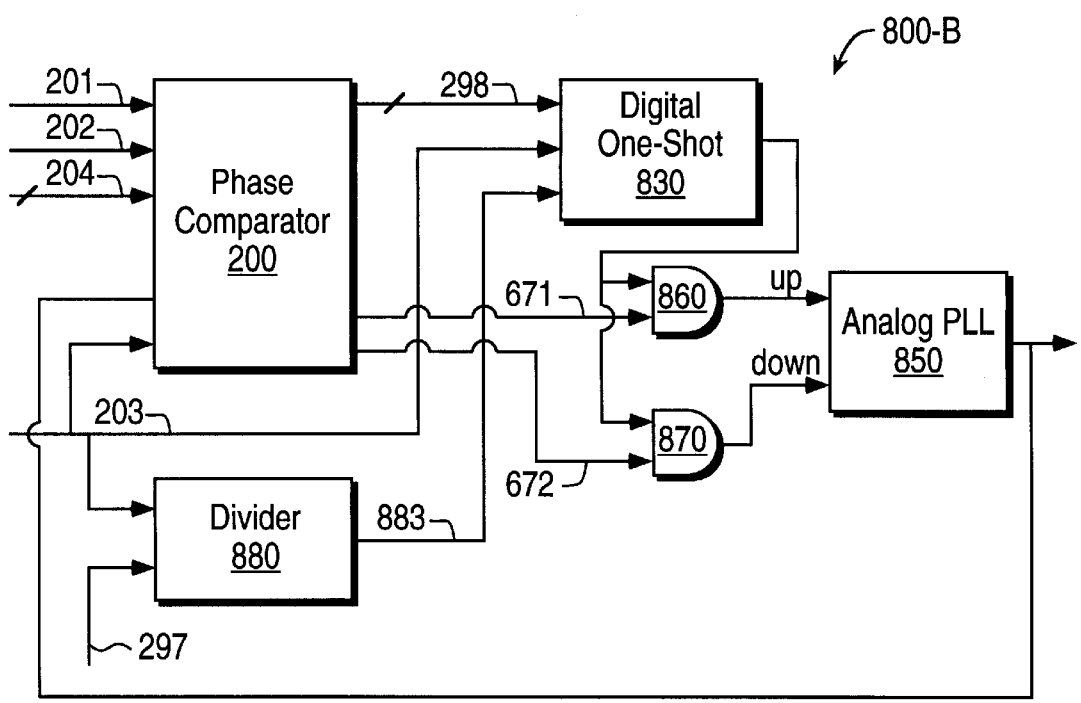
FIG. 8B is a block diagram illustrating the use of a phase comparator in conjunction with an analog PLL.

FIG. 8B is a block diagram of a clock generation circuit 800-B illustrating the use of phase comparator 200 in a analog PLL environment. Divider 880 divides the high frequency clock signal received on line 203 by the value indicated on line 297, and generates a start-cycle signal on line 883. Digital one-shot 830 generates an error pulse having a duration proportional to the value on bus 298. The output of digital one-shot 830 is connected to both AND gates 860 and 870.

AND gate 860 generates an output of 1 if both the line 671 and the output of digital one-shot 830 have a value of 1. Similarly, AND gate 870 generates an output of 1 if both line 672 and the output of digital one-shot 830 have a value of 1. The outputs of AND gates 860 and 870 represent the UP and DOWN inputs respectively of analog PLL 850. Analog PLL 850 modifies the phase of the target clock signal (on line 203) according to the UP and DOWN inputs in a known way. The target clock signal may be synchronized as a result of the modification.

Thus, the present invention can be implemented at least with analog/digital PLLs and delay lock loops. It may be noted that the present invention offers several advantages compared to the prior art system depicted in FIG. 3. For example, the present invention obviates (makes unnecessary) the need for dividers (e.g., 310 and 320), as the phase comparison may be performed without dividing either the reference or the target clock signal.

In addition, the present invention enables the phase comparison cycle to be as short as the frequency of the high frequency clock signal provided on line 203. However, a very short comparison cycle may lead to problems with ripple as described below with reference to FIG. 7C.

9. Minimizing or Eliminating Ripple Effects

As noted above with reference to FIG. 7C, voltage differences between the two auxiliary waveforms may exist at a micro-level, which average out to zero in a reasonably long duration. A signal representing the voltage differences may be referred to as ripple signal. As the difference voltage levels average to zero, it may be undesirable for the target clock signal to track the voltage differences at such a micro-level. The present invention minimizes or eliminates the ripple effects. A combination of several approaches can be used for such a purpose.

In a first approach, a low pass filter (not shown) can be employed at the output of scaler 290, with the filter filtering the output on bus 298, and providing the filtered number to any circuits modifying the phase of a target clock signal. The low pass filter may ensure that the number representing the voltage differences in the ripple do not affect the phase of the target clock signals.

Unfortunately, implementation of low pass filter may require unacceptably high complex circuits at least due to the high speed of operation. In addition, the low pass filter may introduce phase delays in tracking a reference clock signal, and may thus be undesirable. The delays may be particularly unacceptable when the target signal is acquiring the frequency (or phase) of the reference clock signals.

In a second approach, the loop bandwidth of the PLL circuit using phase comparator 200 may be kept low. The low loop bandwidth would prevent the PLL circuit from tracking the reference clock signal quickly, and may be undesirable in certain situations.

In a third approach, the comparison cycle is made long such that phase ripple such as ripple is not tracked. As an illustration, the comparison cycle may be designed to include a few of the high frequency clock (203) cycles. There may be a general trade-off between achieving a short comparison cycle and achieving ripple free operation.

This approach may be implemented, for example, external to phase comparator 200. Even though Δ phase may be generated on line 298 every cycle of the high frequency clock 203, the phase correction may be triggered once a few clock cycles only. A programmable counter may be maintained, which can be set dynamically. A cycle counter may count the number of high frequency clock cycles. When the number equals the number set in the programmable counter, the phase correction may be triggered and the cycle counter may be reset.

In an embodiment, the programmable counter is provided as a 11 bit number. The number needs to be generally large such that any PLL using phase comparator 200 will have sufficient time to perform any computations in tracking the reference clock For example, when the present invention is implemented in conjunction with a PLL described in U.S. Pat. No. 5,796,392, entitled, "A Method and Apparatus for Clock Recovery in a Digital Display Unit", naming as inventor Alexander J Eglit, the high frequency clock signal may have a time period of 5 Nano-seconds, and a comparison cycle may have minimum of 32 clock-cycles.

In a fourth approach, phase difference above a certain threshold only may be used to modify the phase of the target frequency. Such a feature may be implemented in scaler 290 by shifting the n-digit number to the right by a number of bits specified on bus 297. Bus 297 may also be driven by a programmable register. Even though minor phase differences are ignored because of the shift operation, correction is applied if the phase error has to accumulate over time, and many times such tracking provides acceptable results.

Figure 11:
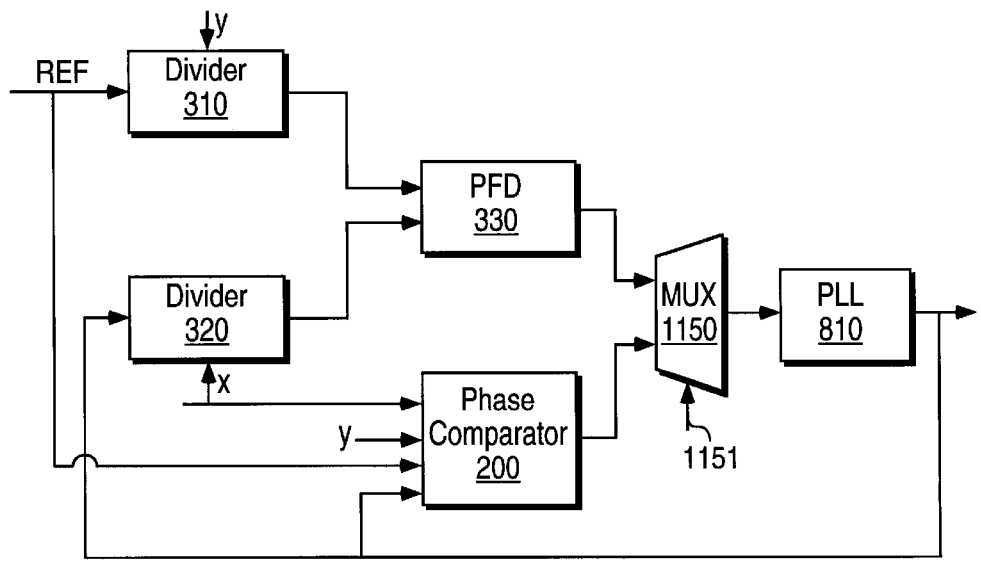
FIG. 11 is a block diagram illustrating the manner in which a clock generation circuit implemented such that the target clock signal does not track phase ripple in the steady state.

In yet another approach illustrated with reference to FIG. 11, multiplexor 1150 may be used to change between the short comparison cycles provided by phase comparator 200 and long comparison cycles provided by other phase comparison circuits. The manner in which the components of FIG. 3 can be combined to achieve such an objective is illustrated in FIG. 11. PFD 330 (and other components described in FIG. 3) provide a phase difference signal with long comparison cycles using dividers 310 and 320. In contrast, phase comparator 200 may provide for short comparison cycles as described above.

Mux select line 1151 may be controlled from an external processor such that the output of phase comparator 200 may be used when the phase of the target clock signal needs to be adjusted quickly (e.g., during phase acquisition), and the output of PFD 330 is used during steady state. As a result, phase ripple may not be tracked in steady state.

Several embodiments can be implemented using a combination of one or more of the above approaches. The computation of some parameters in an example embodiment is described below.

10. Computing Parameters

In general, the frequencies of the reference clock ($F_{ref}$) and target clock ($F_{tar}$) are related by the following equation:

$$F_{tar}=(X/Y)\times F_{ref} \qquad \text{Equation 1}$$

As should be appreciated from the above description, the present invention may operate efficiently irrespective of whether X and Y have large common denominators.

The gain (G) of phase comparator 200 is given by $$G=Y/(S\times T_{tar}) \qquad \text{Equation 2}$$

wherein S is the scaling factor provided on line 297, and $T_{tar}$ represents the time period of the target clock signal. The scaling factor is generally needed to normalize and adjust the gain of phase comparator 200.

If ΔT is the smallest phase error step which needs to be recognized by phase comparator 200, the scaling factor may need to be $$S=Y\times(\Delta T/T_{tar}) \qquad \text{Equation 3}$$

Conversely, if scaling factor (S) is known, the precision of phase comparator 200 may be computed by $$\Delta T=T_{tar}\times(S/Y) \qquad \text{Equation 4}$$

Without a low-pass filter, the output of phase comparator 200 may have a ripple with a maximum amplitude (A) of $$A \leq \max(X, Y)/S, \quad \text{Equation 5}$$

wherein "<=" represents "less than or equal to" relationship;

This may cause an apparent phase error of:

$$\Delta T \leq \max(T_{ref}, T_{tar}) \quad \text{Equation 6}$$

The minimum ripple free resolution of the phase comparator $$\Delta T\_\text{ripple\_free} = \max(T_{ref}, T_{tar}) \quad \text{Equation 7}$$

This means that without a filter the minimum ripple-free time resolution is equal to the period of the slower of the reference and target clock signals. If higher accuracy is needed, the ripple can be filtered out by a PLL using the phase comparator 200. The filtering operation generally depends on the specific implementation of the PLL.

If ripple free operation is required, then the required cycle to cycle target clock jitter may be achieved by selecting loop comparison period larger than some certain minimum. This is due to the fact the phase comparator dead zone error, introduced to suppress the ripple, can be distributed over several target clock cycles.

For illustration, it is assumed that the maximum allowable cycle to cycle jitter of the target clock is max_jitter. This is the sum of systematic jitter caused by the dead zone and some random phase jitter caused by the quantization. A goal may be to keep systematic jitter below the random component so the latter will determine the actual cycle to cycle clock jitter. In this case, the number of clock periods per comparison cycle needed to distribute the systematic dead zone error is:

$$\text{Min\_Ftarget\_Total} = \max(T_{ref}, T_{tar})/\max\_\text{jitter} \quad \text{Equation 8}$$

From this equation one can derive the minimum comparison cycle in the system clocks based on the estimated target period:

$$\min\_CP = \text{Min\_Ftarget\_Total} * T_{tar}/T_{hclk} \quad \text{Equation 9}$$

wherein $T_{hclk}$ represents the time period of the high frequency clock provided on line 203.

$$\text{Comparison Period} = \text{Min\_Ftarget\_Total} * T_{tar}$$

$$= (\max(T_{ref}, T_{tar})/\max\_\text{jitter}) * T_{tar}$$

At least using the equations of above, the features of the present invention described above can be implemented in several environments. Some example environments are described below.

11. Example Environment

In a broad sense, the invention can be implemented in any system which requires a target clock signal to be synchronized with a reference clock signals. The invention has particular application in the display units of computer systems. Accordingly, the present invention is described in the context of computer systems below.

In general, the present invention can be implemented in any display unit of a computer system. The display units may include both CRT display units and digital display units such as a flat panel monitor. The present invention is described in the context of a computer system operating in graphics modes such as EGA, VGA and SVGA modes. Such computer systems include, without limitation, lap-top and desk-top personal computer systems, work-stations, special purpose computer systems, general purpose computer systems, network computers, and many others. The invention may be implemented in hardware, software, firmware, or combination of the like. The above noted graphics modes are described in detail in a book entitled, "Programmer's Guide to the EGA, VGA, and Super VGA Cards", published by Addition-Wesley Publishing Company, by Richard F. Ferraro, ISBN Number 0-201-62490-7, which is incorporated in its entirety herewith.

Figure 9:
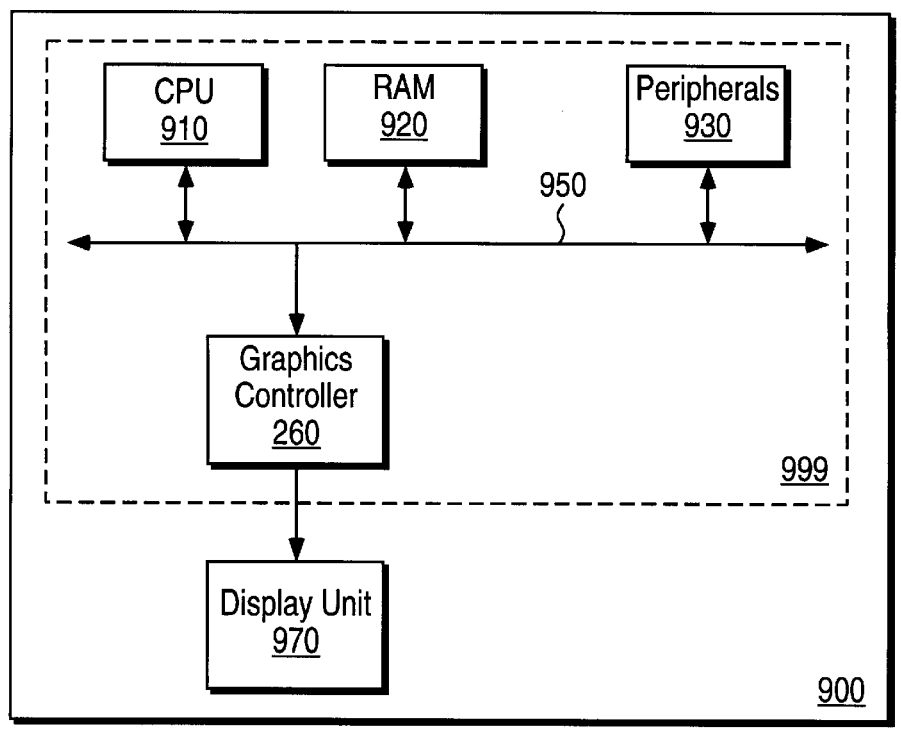
FIG. 9 is a block diagram illustrating a computer system in accordance with the present invention.

FIG. 9 is a block diagram of computer system 900 in which the present invention can be implemented. Computer system 900 includes central processing unit (CPU) 910, random access memory (RAM) 920, one or more peripherals 930, graphics controller 960, and digital display unit 970. CPU 910, RAM 920 and graphics controller 960 are typically packaged in a single unit, and such a unit is referred to as graphics source 999 as an analog display signal is generated by the unit. All the components in graphics source 999 of computer system 900 communicate over bus 950, which can in reality include several physical buses connected by appropriate interfaces.

RAM 920 stores data representing commands and possibly pixel data representing a source image. CPU 910 executes commands stored in RAM 920, and causes different commands and pixel data to be transferred to graphics controller 960. Peripherals 930 can include storage components such as hard-drives or removable drives (e.g., floppy-drives). Peripherals 930 can be used to store commands and/or data which enable computer system 900 to operate in accordance with the present invention. By executing the stored commands, CPU 910 provides the electrical and control signals to coordinate and control the operation of various components.

Graphics controller 960 receives data/commands from CPU 910, generates display signals including display data and corresponding synchronization signals, and provides both to digital display unit 970. Computer system 900 is described with reference to graphics controller 960 generating analog display signals, which may be processed by analog or digital display units. However, the present invention may be implemented in conjunction with other types of display signals (e.g., ones implemented for digital display units) as will be apparent to one skilled in the relevant arts, and such other implementations are contemplated to be within the scope and spirit of the present invention.

Graphics controller 960 can generate an analog display signal in the RS-170 standard with RGB signals in one embodiment In that embodiment, the display signal is in the form of RGB signals and the reference clock signal includes the VSYNC and HSYNC signals well known in the relevant arts. Therefore, three analog display signals (red, green and blue) are generated from each pixel data element. For conciseness, the present invention is described with reference to one display data signal. It should be understood that the description may be applicable to all the three display data signals. It should be fierier understood that the present invention can be implemented with analog image data and/or reference clock signals in other standards even though the present description is provided with reference to ROB signals. Examples of such standards include composite sync standard usually implemented on Macintosh Computer Systems and digital interface (plug and play) compliant with VESA standards for flat-panel monitors.

In general, graphics controller 960 first generates pixel data elements of a source image with a predefined width and height (measured in terms of number of pixel data elements). The pixel data elements for a source image may either be provided by CPU 910 or be generated by graphics controller 960 in response to commands from CPU 910. Graphics controller 960 typically includes a digital to analog converter (DAC) for generating an analog display signal based on the pixel data elements in a known way. The DAC is generally driven by a source clock, and the pixel data elements are encoded at the source clock frequency.

Display unit 970 receives a display signal from graphics controller 960, and displays the images encoded in the display signal by processing the received display signal. The manner in which an embodiment of display unit 970 may process the received display signal is described with reference to FIG. 10.

12. Display Unit

Figure 10:
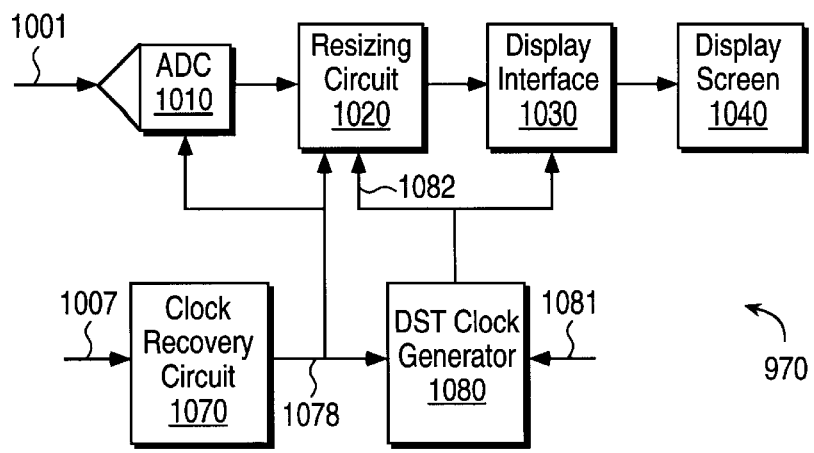
FIG. 10 is a block diagram illustrating a display unit in accordance with the present invention.

The details of an embodiment of display unit 970 is depicted in FIG. 10. Display unit 970 may include analog to digital converter (ADC) 1010, resizing circuit 1020, display interface 1030, display screen 1040, clock recovery circuit 1070, and DST-clock generator 1080. Each block is described below in further detail.

ADC 1010 samples the display data received online 1001 under the control of sampling clock provided on line 1078. For illustration, an image of size A×B pixels may be assumed to be generated, wherein A and B respectively represent the number of lines in a frame, the number of pixel in each line of the frame. The sampled pixel data elements are provided to resizing circuit 1020.

Clock recovery circuit 1070 receives on line 1007 the synchronization signals contained in display signal, and generates a sampling clock synchronized with the synchronization signals. An embodiment of clock recovery circuit is described in detail in U.S. Pat. No. 5,796,392, entitled, "A Method and Apparatus for Clock Recovery in a Digital Display Unit", naming as inventor Alexander J. Eglit, and is incorporated in its entirety into the present application. The generated clock signal is provided on the SCLK line 1078.

DST-clock generator 1080 may correspond to either of the circuits depicted in FIGS. 8A and 8B, which are described in detail above. DST-clock generator 1080 generates a DST-clock signal (destination clock signal), and provides the clock signal to resizing circuit 1020 and display interface 1030. The parameter values (X and Y) necessary for generating the DST-clock a signal may be provided on bus 1081 from programmable registers.

Resizing circuit 1020 receives the DST-clock signal on line 1082 and resizes the image frames provided by ADC 1010. Resizing circuit 1020 may perform resizing operations as may be specified by a user, and provide the resulting pixel data elements to display interface 1030, which generates the display signals to display screen 1040 to cause the resized images to be generated.

To perform resizing operations, resizing circuit 1020 may include large memories (termed frame buffers). Large memories may be undesirable at least due to the additional costs and the space which may be occupied.

Accordingly, an embodiment of resizing circuit 1020, which can resize a source image (of size A×B) to a destination image (of size C×D, wherein C and D respectively represent the number of lines in each frame to be displayed and the number of pixels in each line of the frame to be displayed) without using excessive memory is described in U.S. Pat. No. 5,739,867 entitled, "A Method and Apparatus for Upscaling an Image in Both Vertical and Horizontal Directions", Issued Apr. 14, 1998, naming as inventor Alexander Julian Eglit.

For the embodiment to resize the images as desired, the DST clock signal may need to have a frequency of ((C×D)/(A×B)) times the SRC-clock signal generated on line 1078. Accordingly, in the phase comparator 200 described above, X is set to (C×D), Y is set to (A×B), the SCLK signal generated by clock recovery circuit 1070 is provided as the reference clock and the target clock corresponds to DST-Clock. Using the SRC clock signal and the DST clock signal (on line 1082), resizing circuit 1030 may generate resized images of desired sizes. A method of resizing the circuit is described with reference to FIG. 12.

13. Method of Resizing the Image

Figure 12:
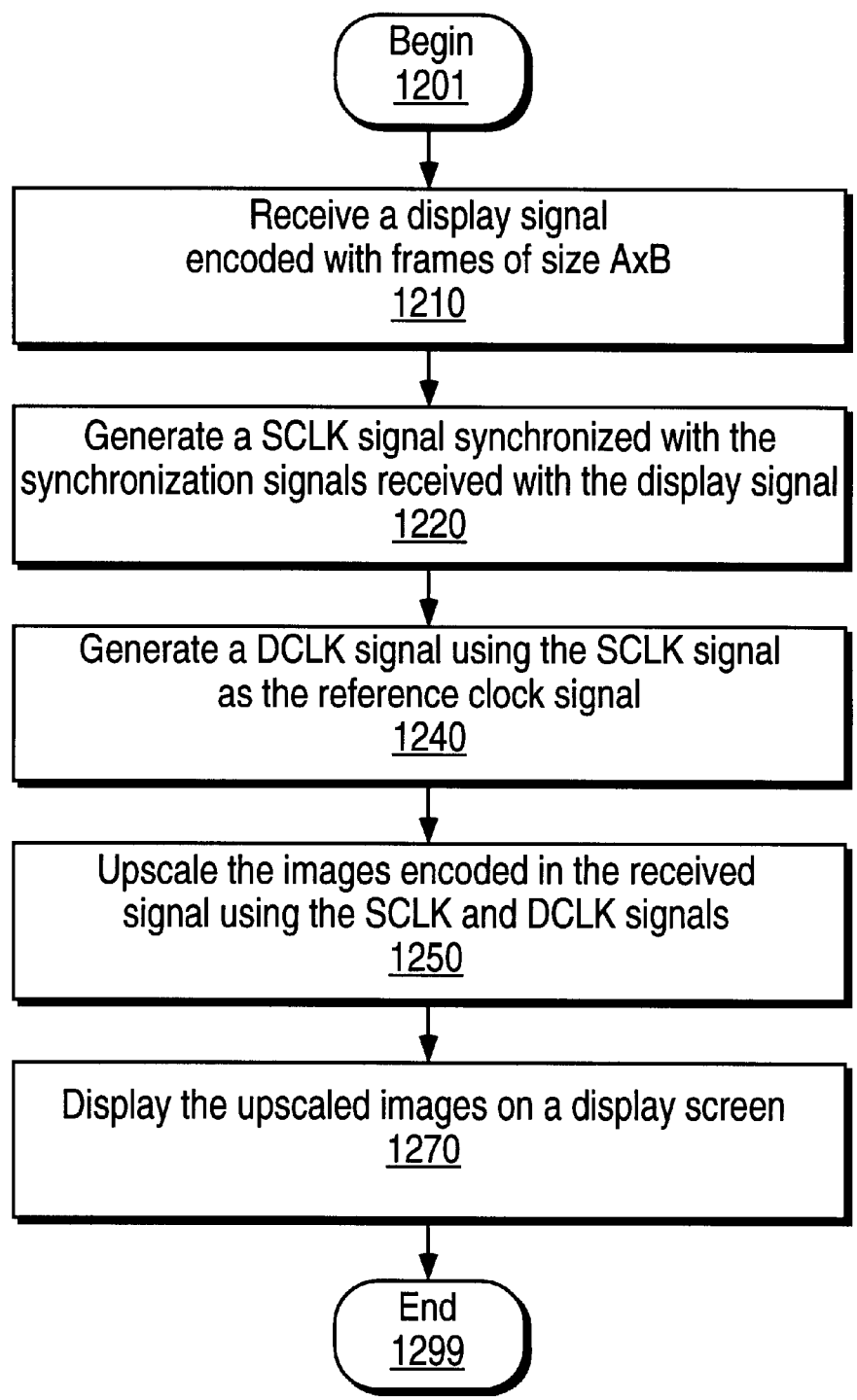
FIG. 12 is a flow chart illustrating the manner in which the present invention can be used to scale an image.

FIG. 12 is a flowchart illustrating a method of displaying resized images in accordance with the present invention. In step 1210, a display unit receives a display signal encoded with frames of size A×B. In step 1220, an SCLK signal synchronized with the synchronization signals contained in the received display signal is generated.

In step 1240, a DST-Clock signal is generated in accordance with the present invention. The SCLK signal is used as the reference clock signal, and the parameter X is set to (C×D) and parameter Y is set to (A×B) in the description of above. In step 1250, the received image frames are scaled using the SCLK and DST-Clock signals. In step 1270, the scaled images are aft displayed on a display screen.

DST-clock signal can be synchronized quickly with the SRC-clock signal, which in turn is generated from the synchronization signals present in a receive display signal. Thus, if a user changes a display mode or refresh rate or the size of the frames to be displayed, the present invention enables the resized images to be generated quickly.

14. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of generating a target clock signal synchronized with a reference clock signal, said method comprising the steps of:

(a) generating a first waveform representing the incremental phase advancement of said reference clock signal between two zero crossings of said first wave form;

(b) generating a second waveform representing the incremental phase advancement of said target clock signal between two zero crossings of said second wave form;

(c) selecting a first sample on said first waveform;

(d) selecting a second sample on said second waveform;

(e) comparing said first sample with said second sample; and (f) adjusting the phase of said target clock signal according to the result of step (e) to generate said target clock signal synchronized with said reference clock signal, wherein steps (a) and (b) together comprise the further step of generating said first waveform and said second waveform such that said two waveforms have the same amplitude for the same phase, whereby said first sample and said second sample respectively comprise the amplitudes of the two waveforms.

2. The method of claim 1, wherein steps (a) and (b) comprise the further step of generating said first waveform and said second waveform to have the same frequency such that the phases of said first waveform and said second waveform represent the accumulated phase of said reference clock signal and said target clock signal respectively.

3. The method of claim 1, wherein said target clock signal has a frequency of (X/Y) times the frequency of said reference clock signal, and wherein steps (a) and (b) comprise the steps of:
   (g) providing a memory element for storing a number representing the accumulated phase of each of said reference clock signal and target clock signal;
   (h) incrementing the value in said memory element corresponding to said reference clock X signal by X for each clock period of said reference clock signal; and
   (i) incrementing the value in said memory element corresponding to said target clock signal by Y for each clock period of said target clock signal,
      wherein the outputs of said memory elements represent said two waveforms generated in steps (a) and (b).

4. The method of claim 3, wherein said method is implemented in a display unit of a computer system.

5. The method of claim 4, further comprising the steps of:
   (i) receiving a display signal encoding a plurality of frames, each frame having a size of A×B pixel data elements, wherein each flame is to be displayed as a frame having a size of C×D pixel data elements;
   (j) setting X=(C×D) and Y=(A×B);
   (k) generating a SRC-clock signal synchronized with the synchronization signals contained in said display signal;
   (l) providing said SRC-clock signal as said reference clock signal and generating said target clock signal as a DST-clock signal;
   (m) using said DST-clock signal and said SRC-clock signal to resize said frames; and
   (n) displaying said resized images on a display screen.

6. The method of claim 1, further comprising the step of:
   (o) reducing or eliminating the effects of ripple, wherein the ripple corresponds to the short term differences in voltage levels of said two waveforms, with the short term differences averaging to zero in a ripple cycle.

7. The method of claim 6, wherein step (o) comprises the steps of:
   passing the output of step (e) through a low pass filter; and
   using the output of said low pass filter to adjust the phase of said target signal.

8. The method of claim 6, wherein step (o) comprising the step of using a PLL of a low loop bandwidth in step (e) for adjusting the phase of said target clock signal.

9. The method of claim 6, wherein step (o) comprises the steps of:
   scaling the comparison result of step (e) to a smaller number; and
   using the scaled number to adjust the phase of said target clock signal.

10. The method of claim 6, wherein step (o) comprises the steps of:
   (p) generating phase comparison signals with a larger comparison cycle than in step (e);
   (q) providing the phase comparison signals of step (p) to adjust the phase of said target clock signal in a steady state and using step (e) to adjust the phase of said target clock signal otherwise.

11. The method of claim 1, wherein said first sample and said second sample are taken at the same time point.

12. A clock generation circuit for generating a target clock signal synchronized with a reference clock signal, said circuit comprising:
   means for generating a first waveform representing the incremental phase advancement of said reference clock signal between two zero crossings of said first wave form;
   means for generating a second waveform representing the incremental phase advancement of said target clock signal between two zero crossings of said second wave form;
   means for selecting a first sample on said first waveform;
   means for selecting a second sample on said second waveform;
   means for comparing said first sample with said second sample; and
   means for adjusting the phase of said target clock signal according to the comparison result to generate said target clock signal synchronized with said reference clock signal,
   wherein said means for generating a first waveform and means for generating a second waveform are designed to generate said first waveform and said second waveform such that said two waveforms have the same amplitude for the same phase, whereby said first sample and said second sample respectively comprise the amplitudes of the two waveforms.

13. A clock generation circuit for generating a target clock signal synchronized with a reference clock signal, said circuit comprising:
   a first circuit generating a first waveform representing the incremental phase advancement of said reference clock signal between two zero crossings of said first wave form;
   a second circuit generating a second waveform representing the incremental phase advancement of said target clock signal between two zero crossings of said second wave form;
   a comparison circuit coupled to said first circuit and said second circuit, said comparison circuit for comparing said first waveform and said second waveform;
   a phase-lock loop (PLL) coupled to said comparison circuit, said PLL for receiving the result of said comparison, and adjusting the phase of said target clock signal according to the result of comparison to synchronize said target clock signal with said reference clock signals
   wherein said first circuit and said second circuit are designed to generate said first waveform and said second waveform such that said two waveforms have the same amplitude for the same phase, whereby said first sample and said second sample respectively comprise the amplitudes of the two waveforms.

14. The clock generation circuit of claim 13, wherein said first circuit and said second circuit are designed to generate said first waveform and said second waveform to have the same frequency such that the phases of said first waveform and said second waveform represent the accumulated phase of said reference clock signal and said target clock signal respectively.

15. The clock generation circuit of claim 13, wherein said target clock signal has a frequency of (X/Y) times the frequency of said reference clock signal, wherein said first circuit comprises a first memory element for storing a number representing the accumulated phase of said reference clock signal, and a first adder for incrementing said first memory element by X for each clock period of said reference clock signal;

and wherein said second circuit comprises a second memory element for storing a number representing the accumulated phase of said target clock signal, and a second adder for incrementing said second memory element by Y for each clock period of said target clock signal;

wherein the outputs of said first memory element and said second memory element represent said first waveform and said second waveform respectively.

16. The clock generation circuit of claim 13, further comprising a synchronization circuit for providing to said adder a first sample from said first waveform and a second sample from said second waveform, wherein said synchronization circuit provides said first sample and said second sample at the same time point.

17. The clock generation circuit of claim 16, wherein said synchronization circuit further comprises a resampling block driven by a high frequency clock signal having much higher frequency than said target clock signal, wherein said resampling block generates a clocking signal to said register.

18. The phase comparator of claim 16, wherein said synchronization circuit further comprises a second register coupled to the output of said first register, and wherein the output of said second register is coupled to the input of said comparator, and wherein said second register is clocked by a high frequency clock signal having frequency much greater than the frequency of said reference clock signal.

19. The phase comparator of claim 14, further comprising a prevention circuit for preventing said PLL from responding to short-term frequency drifts.

20. The clock generation circuit of claim 19, wherein said prevention circuit comprises a low-pass filter coupled between said comparison circuit and said PLL.

21. The clock generation circuit of claim 19, wherein said prevention circuit is implemented by using said PLL of a low loop bandwidth.

22. The clock generation circuit of claim 19, wherein said prevention circuit comprises a scaling circuit for scaling the output of said comparison circuit such that small phase differences are not tracked in said target clock signal.

23. The clock generation circuit of claim 22, wherein said scaling circuit is implemented as a shift register.

24. The clock generation circuit of claim 19, wherein said prevention circuit comprises:

a PFD circuit for generating phase comparison signals with a larger comparison cycle than said comparator circuit; and a multiplexor for selectively coupling either said phase comparison signals of said PFD circuit or the result of comparison of said comparison circuit.

25. The clock generation circuit of claim 13, wherein said comparison circuit comprises a third adder.

26. A digital display unit for displaying a plurality of image frames encoded in a display signal, said digital display unit comprising:

a clock generation circuit generating a destination clock signal synchronized with a sampling clock signal, said circuit comprising:

a first circuit generating a first waveform representing the incremental phase advancement of said sampling clock signal between two zero crossings of said first wave form;

a second circuit generating a second waveform representing the incremental phase advancement of said destination clock signal between two zero crossings of said second wave form;

a comparison circuit coupled to said first circuit and said second circuit, said comparison circuit comparing said first waveform and said second waveform; and a phase-lock loop (PLL) coupled to said comparison circuit, said PLL receiving the result of said comparison, and adjusting the phase of said destination clock signal according to the result of to synchronize said destination clock signal with said sampling clock signal, wherein said first circuit and said second circuit are designed to generate said first waveform and said second waveform such that said two waveforms have the same amplitude for the same phase, whereby said first sample and said second sample respectively comprise the amplitudes of the two waveforms;

an analog-to-digital converter (ADC) receiving said display signal, and sampling said display signal under the control of said sampling clock to generate a plurality of sampled data elements, wherein said plurality of sampled data elements represent an image frame;

a resizing circuit receiving said sampling clock signal and said destination clock signal, said resizing circuit processing said plurality of pixel data elements to generate to a resized image frame;

a display screen; and a display interface displaying said resized image on said display screen.

27. The digital display unit of claim 26, wherein said first circuit and said second circuit are designed to generate said first waveform and said second waveform to have the same frequency such that the phases of said first waveform and said second waveform represent the accumulated phase of said reference clock signal and said target clock signal respectively.

28. The digital display unit of claim 26, wherein said target clock signal has a frequency of (X/Y) times the frequency of said reference clock signal, wherein said first circuit comprises a first memory element for storing a number representing the accumulated phase of said reference clock signal, and a first adder for incrementing said first memory element by X for each clock period of said reference clock signal;

and wherein said second circuit comprises a second memory element for storing a number representing the accumulated phase of said target clock signal, and a second adder for incrementing said second memory element by Y for each clock period of said target clock signal;

wherein the outputs of said first memory element and said second memory element represent said first waveform and said second waveform respectively.

29. The digital display unit of claim 26, further comprising a synchronization circuit for providing to said adder a first sample from said first waveform and a second sample from said second waveform, wherein said synchronization circuit provides said first sample and said second sample at the same time point.

30. The digital display unit of claim 29, wherein said synchronization circuit further comprises a resampling block driven by a high frequency clock signal having much higher frequency than said target clock signal, wherein said resampling block generates a clocking signal to said register.

31. The digital display unit of claim 29, wherein said synchronization circuit further comprises a second register coupled to the output of said first register, and wherein the output of said second register is coupled to the input of said comparator, and wherein said second register is clocked by a high frequency clock signal having frequency much greater than the frequency of said reference clock signal.

32. The digital display unit of claim 27, further comprising a prevention circuit for preventing said PLL from responding to short-term frequency drifts.

33. The digital display unit of claim 32, wherein said prevention circuit comprises a low-pass filter coupled between said comparison circuit and said PLL.

34. The digital display unit of claim 32, wherein said prevention circuit is implemented by using said PLL of a low loop bandwidth.

* * * * *